United States Patent
Lee et al.

(10) Patent No.: US 11,362,052 B2
(45) Date of Patent: Jun. 14, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Chi-Chang Lee, Kaohsiung (TW); Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 158 days.

(21) Appl. No.: 16/732,071

(22) Filed: Dec. 31, 2019

(65) Prior Publication Data

US 2021/0202413 A1    Jul. 1, 2021

(51) Int. Cl.
*H01L 23/00* (2006.01)
*H01L 23/31* (2006.01)
*H01L 25/065* (2006.01)

(52) U.S. Cl.
CPC .......... *H01L 24/05* (2013.01); *H01L 23/3135* (2013.01); *H01L 24/03* (2013.01); *H01L 24/06* (2013.01); *H01L 24/16* (2013.01); *H01L 25/0657* (2013.01); *H01L 2224/03464* (2013.01); *H01L 2224/03622* (2013.01); *H01L 2224/0401* (2013.01); *H01L 2224/05019* (2013.01); *H01L 2224/05559* (2013.01); *H01L 2224/05567* (2013.01); *H01L 2224/05573* (2013.01); *H01L 2224/0603* (2013.01); *H01L 2224/16148* (2013.01); *H01L 2225/06513* (2013.01); *H01L 2225/06565* (2013.01)

(58) Field of Classification Search
CPC ...................................................... H01L 24/05
See application file for complete search history.

(56) References Cited

U.S. PATENT DOCUMENTS

| | | | |
|---|---|---|---|
| 8,390,116 B1 | 3/2013 | Huemoeller et al. | |
| 9,484,291 B1* | 11/2016 | Dhandapani | H01L 24/10 |
| 2002/0149118 A1* | 10/2002 | Yamaguchi | H01L 24/13 |
| | | | 257/778 |

* cited by examiner

*Primary Examiner* — William A Harriston
(74) *Attorney, Agent, or Firm* — Foley & Lardner LLP

(57) ABSTRACT

A semiconductor device package includes a first electronic component having a first surface and a second surface opposite the first surface. The semiconductor device package further includes a first pad disposed on the first surface of the first electronic component. The first pad has a first surface facing away from the first surface of the first electronic component, a second surface opposite the first surface of the first pad, and a lateral surface extended between the first surface of the first pad and the second surface of the first pad. The semiconductor device package further includes a second pad disposed on the first surface of the first pad. The second pad has a first surface facing away from the first surface of the first pad, a second surface opposite the first surface of the second pad, and a lateral surface extended between the first surface of the second pad and the second surface of the second pad. A width of the first surface of the second pad is greater than a width of the second surface of the second pad. A method of manufacturing a semiconductor device package is also disclosed.

14 Claims, 20 Drawing Sheets

SEMICONDUCTOR DEVICE PACKAGE AND METHOD OF MANUFACTURING THE SAME

BACKGROUND

1. Technical Field

The present disclosure generally relates to a semiconductor device package and a method of manufacturing the same, and to a semiconductor device package including conductive pillars and conductive pads.

2. Description of the Related Art

In comparative semiconductor structures, conductive elements (e.g., conductive pillars, pads or bumps) are used as interconnections for two or more devices. As the pitch of the conductive elements is further reduced to accommodate increasing I/O pins, it becomes more challenging to align the interconnections.

SUMMARY

In one or more embodiments, a semiconductor device package includes a first electronic component having a first surface and a second surface opposite the first surface. The semiconductor device package further includes a first pad disposed on the first surface of the first electronic component. The first pad has a first surface facing away from the first surface of the first electronic component, a second surface opposite the first surface of the first pad, and a lateral surface extended between the first surface of the first pad and the second surface of the first pad. The semiconductor device package further includes a second pad disposed on the first surface of the first pad. The second pad has a first surface facing away from the first surface of the first pad, a second surface opposite the first surface of the second pad, and a lateral surface extended between the first surface of the second pad and the second surface of the second pad. A width of the first surface of the second pad is greater than a width of the second surface of the second pad.

In one or more embodiments, a semiconductor device package includes a first electronic component having a first surface and a second surface opposite the first surface and a second electronic component having a surface facing the first surface of the first electronic component. The semiconductor device package further includes a first pad disposed on the first surface of the first electronic component. The first pad has a first surface and a second surface. The semiconductor device package further includes a second pad disposed on the first surface of the first pad. The second pad has a first surface and a second surface. The semiconductor device package further includes a conductive pillar electrically connected the surface of the second electronic component with the first surface of the second pad. A width of the second surface of the second pad is smaller a width of the second surface of the first pad.

In one or more embodiments, a method for manufacturing a semiconductor device package includes providing an electronic component and disposing a first photoresist on the electronic component. The first photoresist has an opening. The method further includes forming a first conductive layer in the opening. The first conductive layer has a first surface exposed from the first photoresist. The method further includes disposing a second photoresist to cover the first surface of the first conductive layer. The method further includes removing a part of the second photoresist to expose a part of the first surface of the first conductive layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
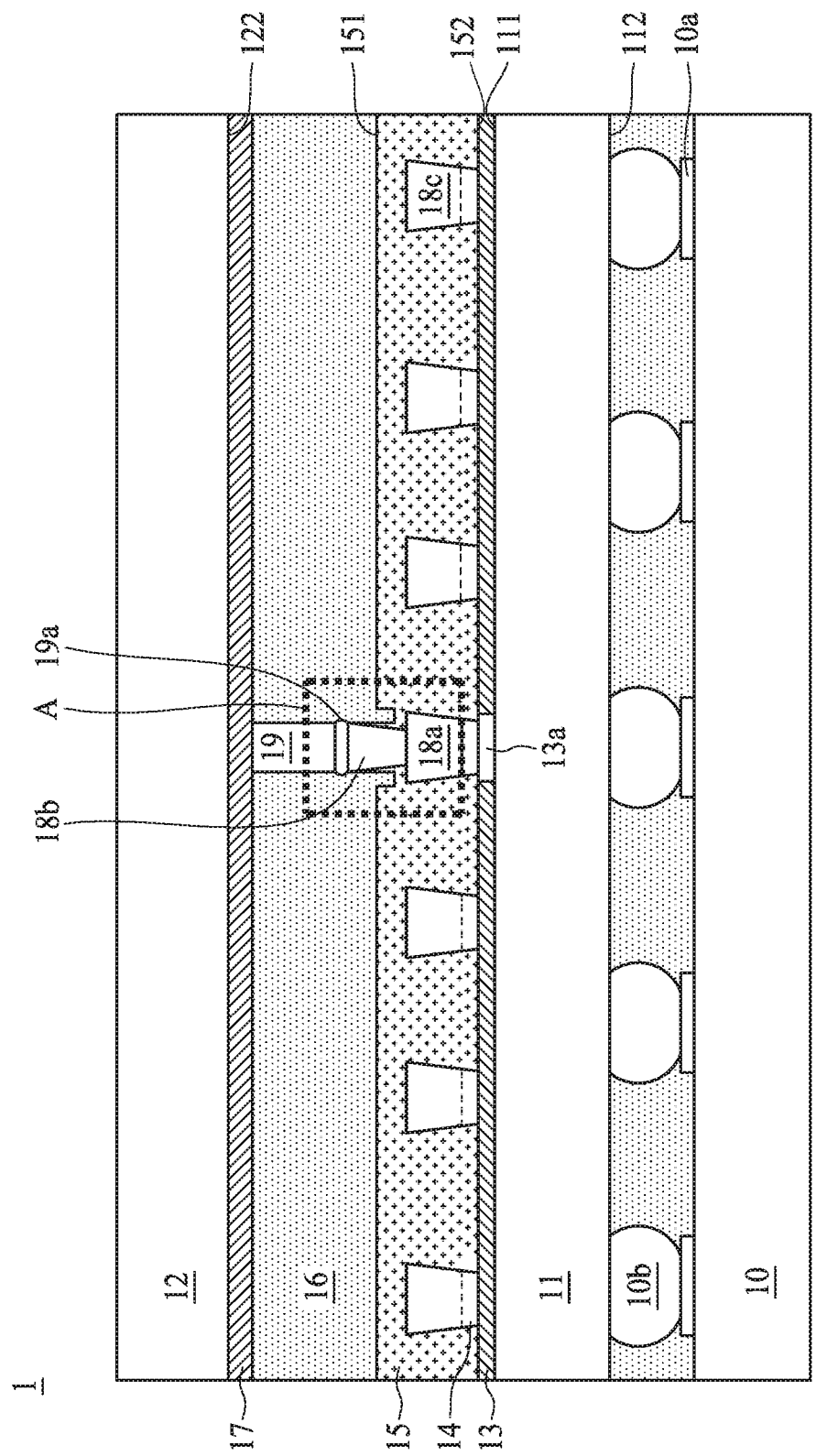
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes a substrate 10, electronic components 11 and 12, passivation layers 13 and 17, a conductive layer 14, a dielectric layer 15, an underfill 16, conductive pads 18a, 18b, and 18c, and a conductive pillar 19.

The electronic component 11 has a surface 111 (e.g., an active surface) facing the electronic component 12 (e.g., an active surface of the electronic component 12) and a surface 112 opposite the surface 111.

Each of the electronic components 11 and 12 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The passivation layer 13 is disposed on the surface 111 of the electronic component 11. The passivation layer 13 covers a portion of the surface 111 and exposes a conductive pad 13a provided on the electronic component 11. In some embodiments, the passivation layer 13 may include, for example, silicon oxide, silicon nitride, gallium oxide, aluminum oxide, scandium oxide, zirconium oxide, lanthanum oxide or hafnium oxide. In some embodiments, the conductive pad 13a may include, for example, aluminum (Al), copper (Cu), or other suitable metal, or a mixture, an alloy, or other combination of two or more thereof.

The conductive layer 14 is disposed on the electronic component 11. The conductive layer 14 may be partially covered by the passivation layer 13. The conductive layer 14 is electrically connected to the conductive pad 13a. The conductive layer 14 may include, for example, titanium (Ti), Cu, nickel (Ni), another metal, or an alloy (such as a titanium-tungsten alloy (TiW)). In some embodiments, the conductive layer 14 may be a seed layer.

The conductive pads 18a and 18c are disposed on the conductive layer 14. The conductive pad 18c is disposed adjacent to the conductive pad 18a and spaced apart from the conductive pad 18a.

The conductive pad 18b is disposed on the conductive pad 18a. In other words, the conductive pad 18a is disposed between the conductive layer 14 and the conductive pad 18b.

The conductive pillar 19 is disposed on the electronic component 12. The conductive pillar 19 may be partially covered by the passivation layer 17 provided on a surface of the electronic component 12 facing the electronic component 11. The conductive pillar 19 is bonded with the conductive pad 18b to electrically connect the electronic component 12 (such as the interconnection structures in the electronic component 12) to the conductive pad 13a.

Each of the conductive pads 18a, 18b, and 18c and the conductive pillar 19 may include, for example, gold (Au), silver (Ag), Cu, Ni, palladium (Pd), another metal, a solder alloy, or a combination of two or more thereof.

In some embodiments, the conductive pads 18a, 18b, and 18c may be a redistribution layer (RDL) or a grounding element.

The dielectric layer 15 is disposed on the surface 111 of the electronic component 11 to cover or encapsulate the conductive pads 18a and 18c. For example, the dielectric layer 15 covers or encapsulates the sidewalls and the top surfaces of the conductive pads 18a and 18c. The dielectric layer 15 surrounds the sidewall of the conductive pad 18b.

In some embodiments, the dielectric layer 15 may include, for example, one or more organic materials (e.g., phosphoric anhydride (PA), a polyimide (PI), a polybenzoxazole (PBO), an epoxy, and an epoxy-based material), or one or more inorganic materials (e.g., silicon, a glass, a ceramic, and an oxide). In some embodiments, the dielectric layer 15 may include, for example, photoresist, such as positive photoresist or negative photoresist.

The underfill 16 (or may also be referred to as a package body) is disposed between the dielectric layer 15 and the passivation layer 17.

In some embodiments, the underfill 16 may include, for example, an epoxy resin, a molding compound (e.g., an epoxy molding compound or other molding compounds), a polyimide, a phenolic compound or material, a material including a silicone dispersed therein, or a combination thereof.

The substrate 10 is electrically connected to the electronic component 11 through an electrical contact 10b (e.g. a solder ball) provided on the surface 112 of the electronic component 11. The substrate 10 may be, for example, a printed circuit board, such as a paper-based copper foil laminate, a composite copper foil laminate, or a polymer-impregnated glass-fiber-based copper foil laminate. The substrate 10 may include one or more conductive pads 10a in proximity to, adjacent to, or embedded in and exposed at a surface of the substrate 10.

The electrical contact 10b is disposed on the conductive pads 10a. In some embodiments, the electrical contact 10b includes a controlled collapse chip connection (C4) bump, a ball grid array (BGA) or a land grid array (LGA).

In some comparative embodiments, the conductive pad 18b can be omitted, and a longer conductive pillar 19 is electrically connected to the conductive pad 13a only through the conductive pad 18a. However, the distance between the dielectric layer 15 and the conductive pad 18a (e.g., the alignment tolerance) is about 2 micrometers (μm)—which suppresses the manufacturing speed—and the conductive pillar 19 may be cracked or bent by the dielectric layer 15.

As shown in FIG. 1, the conductive pad 18c is covered in the dielectric layer 15 and does not contact the conductive pillar 19. The conductive pad 18b, which contacts the conductive pillar 19, is higher or elevated in comparison with the other conductive pads (such as the conductive pad 18c). As such, the conductive pillar 19 contacts the conductive pad 18b precisely, achieving a highly accurate alignment and preventing the conductive pillar 19 from being cracked or bent by the dielectric layer 15.

In addition, the alignment tolerance can be increased and the manufacturing speed can be accelerated. For example, in comparison with a device package without an elevated conductive pad for bonding to the pillar, the alignment tolerance can be increased from about 2 μm to about 20 μm, and the units produced per hour can be boosted by about 10 times.

Although FIG. 1 shows that there is one conductive pad that is elevated with respect to the other six conductive pads (spaced apart from the one conductive pad) to provide electrical connections between the electronic components 11 and 12, the present disclosure is not limited thereto. In some embodiments, there may be any number of conductive pads depending on product specifications.

Figure 2:
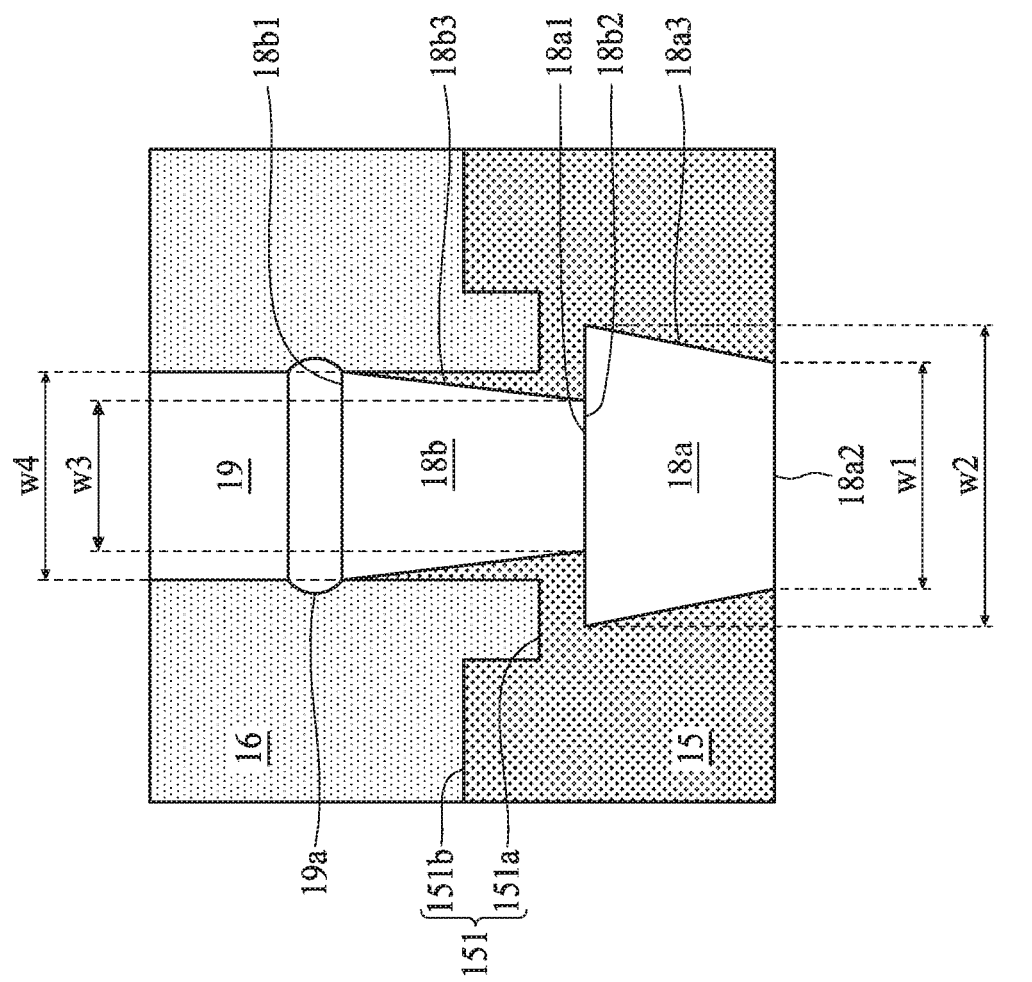
FIG. 2 illustrates an enlarged view of a portion in a dotted box A as shown in FIG. 1 in accordance with some embodiments of the present disclosure.

FIG. 2 illustrates an enlarged view of a portion in a dotted box A as shown in FIG. 1 in accordance with some embodiments of the present disclosure.

The conductive pad 18a has a surface 18a1 facing away from the electronic component 11, a surface 18a2 opposite the surface 18a1, and a lateral surface (or a sidewall) 18a3 extended between the surface 18a2 and the surface 18a1.

The conductive pad 18a tapers toward the electronic component 11. For example, the lateral surface 18a3 defines an acute angle with the surface 18a1. For example, a width (denoted as "w2" in FIG. 2) of the surface 18a1 is greater than a width (denoted as "w1" in FIG. 2) of the surface 18a2.

The conductive pad 18b has a surface 18b1 facing away from the electronic component 11, a surface 18b2 opposite the surface 18b1, and a lateral surface (or a sidewall) 18b3 extended between the surface 18b2 and the surface 18b1.

The conductive pad 18b tapers toward the surface 111 of electronic component 11. For example, the lateral surface 18b3 defines an acute angle with the surface 18b1. For example, a width (denoted as "w4" in FIG. 2) of the surface 18b1 is greater than a width (denoted as "w3" in FIG. 2) of the surface 18b2.

The width w2 of the surface 18a1 is greater than the width w3 of the surface 18b2.

The surface 18b2 is in contact with the surface 18a1. The surface 18a1 is partially covered by the surface 18b2. For example, a part of the surface 18a1 is covered by the surface 18b2, while the other part of the surface 18a1 is covered by the dielectric layer 15.

The dielectric layer 15 surrounds or covers the lateral surface 18a3 of the conductive pad 18a. The dielectric layer 15 surrounds or covers the lateral surface 18b3 of the conductive pad 18b. The lateral surface 18a3 of the conductive pad 18a may be fully surrounded or covered by the dielectric layer 15. The lateral surface 18b3 of the conductive pad 18b may be fully surrounded or covered by the dielectric layer 15.

The surface 18b1 of the conductive pad 18b is not covered by the dielectric layer 15. In other words, the surface 18b1 of the conductive pad 18b is exposed from the dielectric layer 15. The surface 18b1 of the conductive pad 18b is in contact with an electrical contact 19a (e.g. a solder ball) and is electrically connected to the conductive pillar 19 through the electrical contact 19a.

In some embodiments, the dielectric layer 15 releases the stress concentration generated on heterojunction (as in the interface between the underfill 16 and the conductive pad 18a when the conductive pad 18a is not surrounded by the dielectric layer 15) caused by, for example, a die saw or a thermal test.

In some embodiments, the dielectric layer 15 fully covers the lateral surface 18b3 and isolates the lateral surface 18b3 from the electrical contact 19a, thereby preventing the formation of intermetallic compounds (IMC) and enhancing the reliability of the device package.

The underfill 16 is in contact with the dielectric layer 15 and defines an interface 151 with the dielectric layer 15. The underfill 16 surrounds or covers the portion of the dielectric layer 15 that surrounds the lateral surface 18b3 of the conductive pad 18b. For example, the lateral surface 18b3 of the conductive pad 18b is surrounded by the dielectric layer 15 and further surrounded by the underfill 16. For example, a portion of the dielectric layer 15 is between the conductive pad 18b and the underfill 16.

The interface 151 between the underfill 16 and the dielectric layer 15 has a portion 151a and a portion 151b connected with and adjacent to the portion 151a. The portion 151a is closer to the conductive pad 18b. The portion 151a is proximal to the conductive pad 18b, while the portion 151b is distal from the conductive pad 18b.

The portion 151a is not coplanar with the portion 151b. For example, the portion 151a is recessed from the portion 151b. For example, the portion 151a defines a cavity, which is filled by the underfill 16. In some embodiments, the recessed portion enhances the adhesion strength between the dielectric layer 15 and the underfill 16.

Figure 4A:
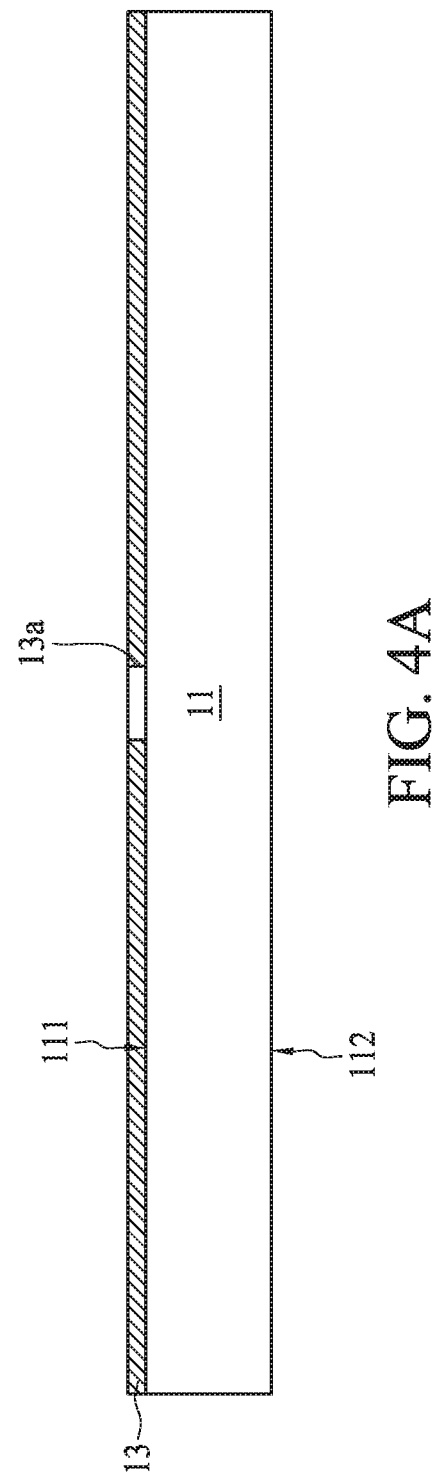
FIG. 4A illustrates one or more stages of a method of manufacturing a semiconductor device package in accordance with some embodiments of the present disclosure.
Figure 4B:
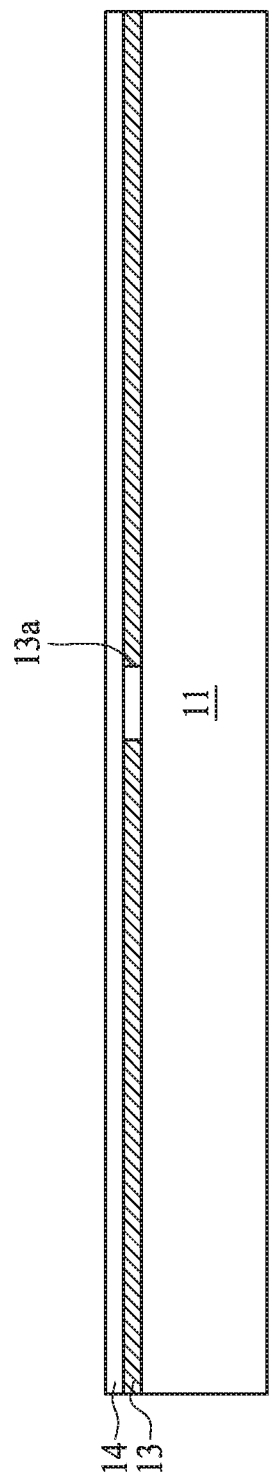
FIG. 4B illustrates one or more stages of a method of manufacturing a semiconductor device package in accordance with some embodiments of the present disclosure.
Figure 4C:
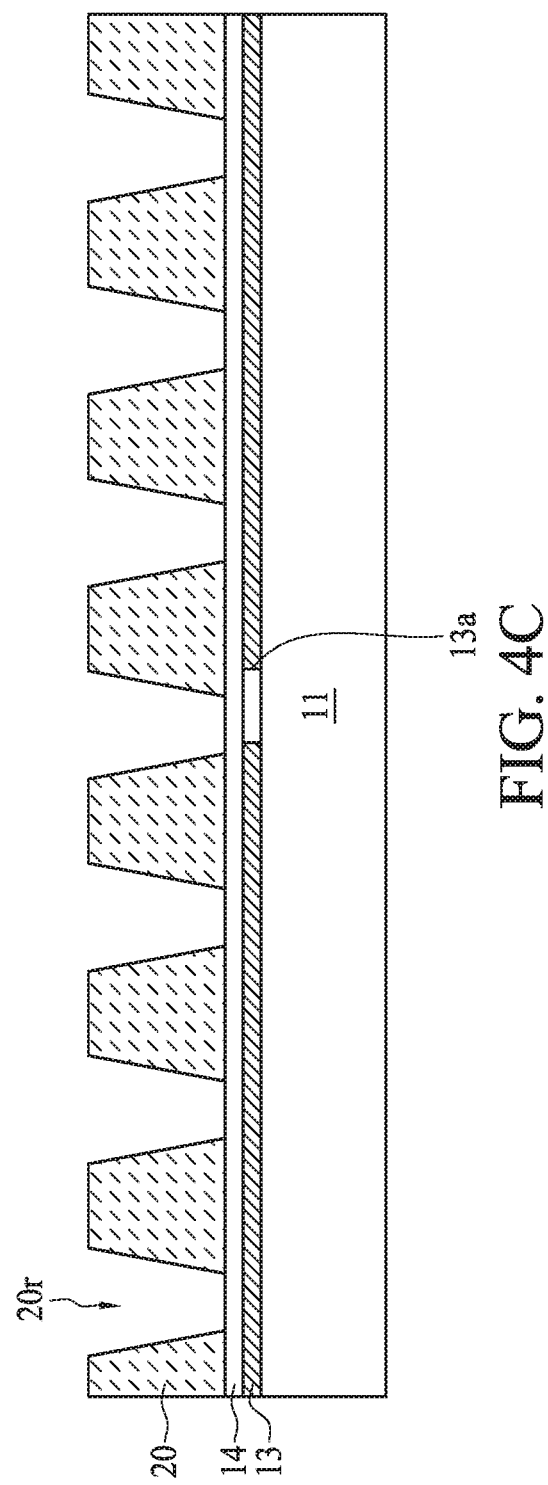
FIG. 4C illustrates one or more stages of a method of manufacturing a semiconductor device package in accordance with some embodiments of the present disclosure.
Figure 4D:
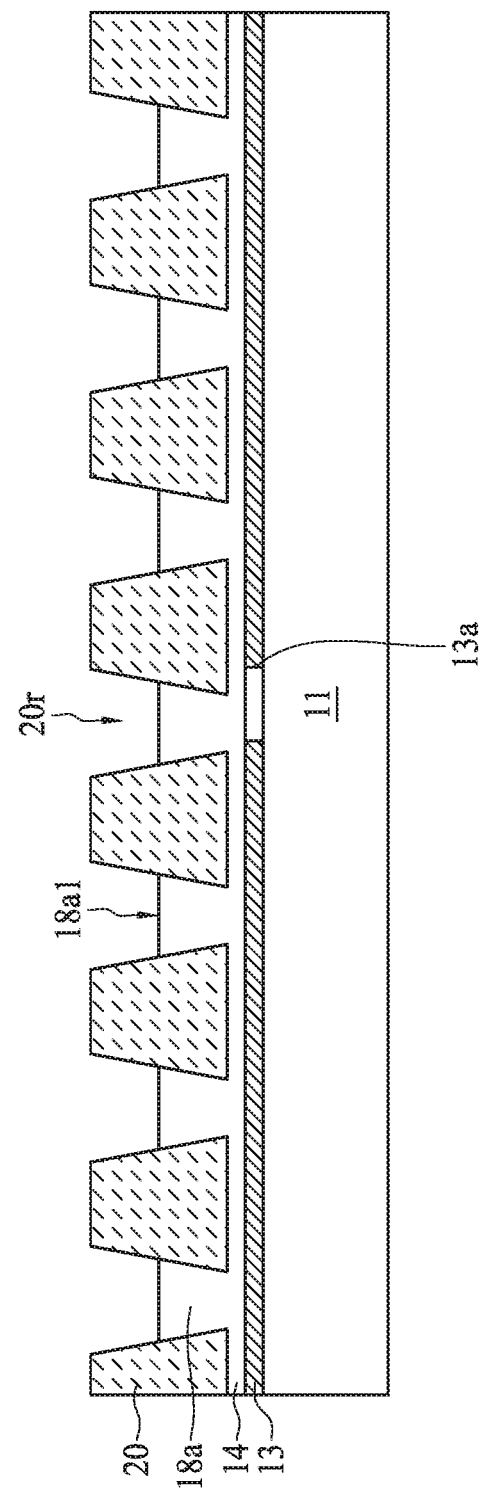
FIG. 4D illustrates one or more stages of a method of manufacturing a semiconductor device package in accordance with some embodiments of the present disclosure.
Figure 4E:
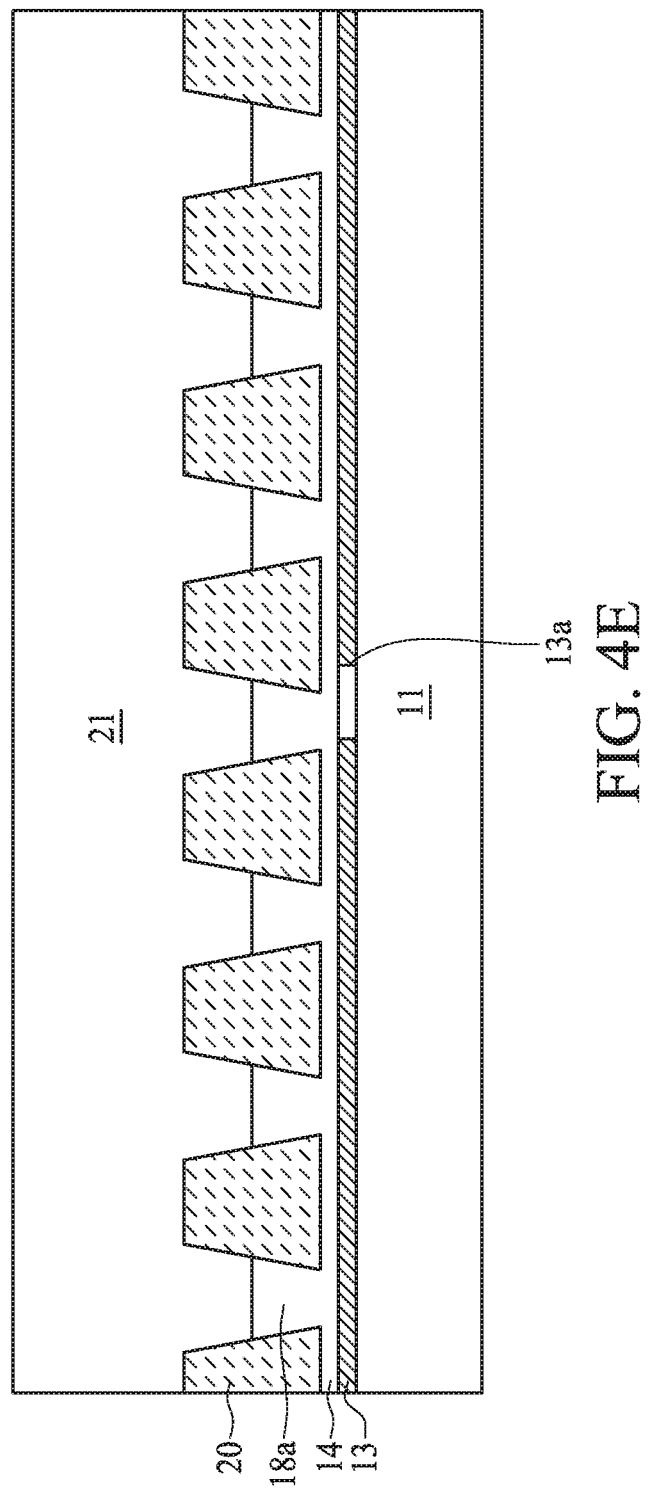
FIG. 4E illustrates one or more stages of a method of manufacturing a semiconductor device package in accordance with some embodiments of the present disclosure.
Figure 4F:
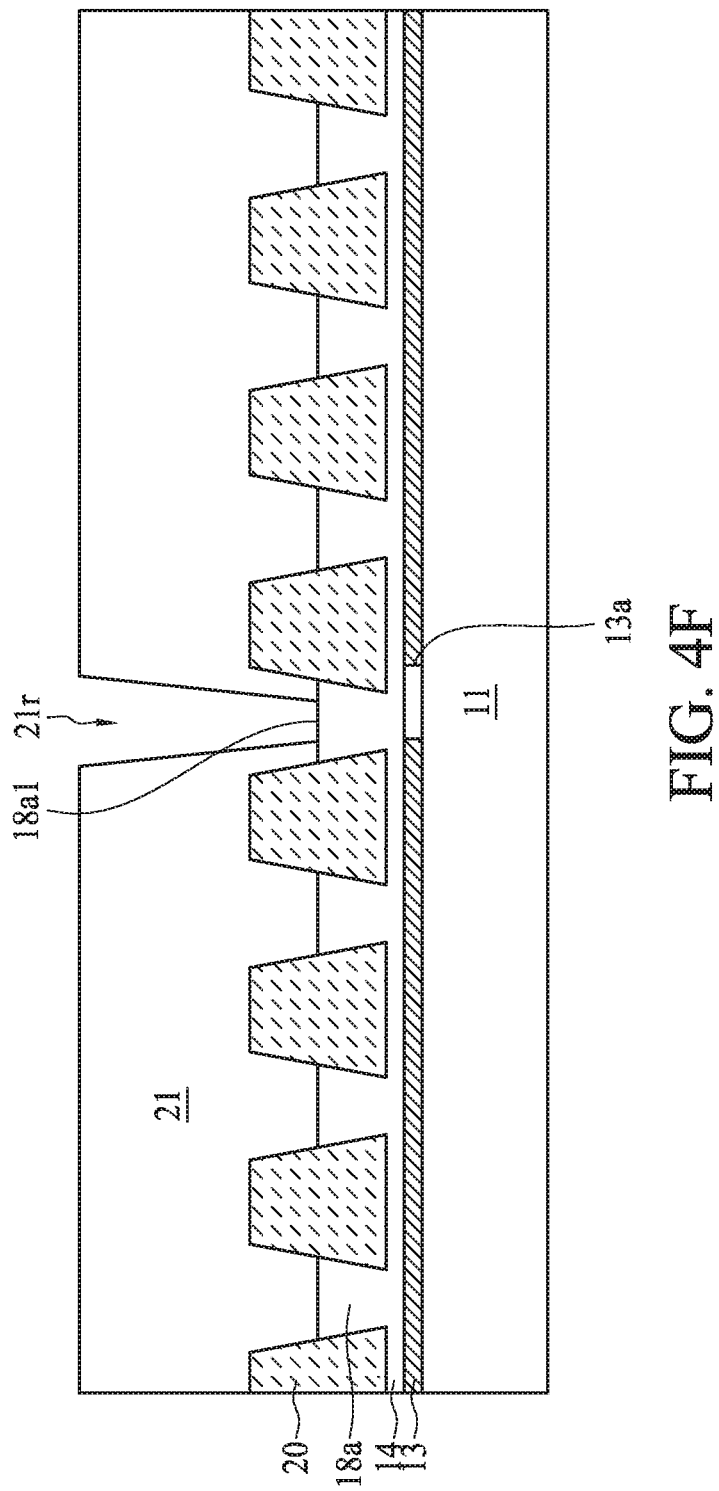
FIG. 4F illustrates one or more stages of a method of manufacturing a semiconductor device package in accordance with some embodiments of the present disclosure.
Figure 4G:
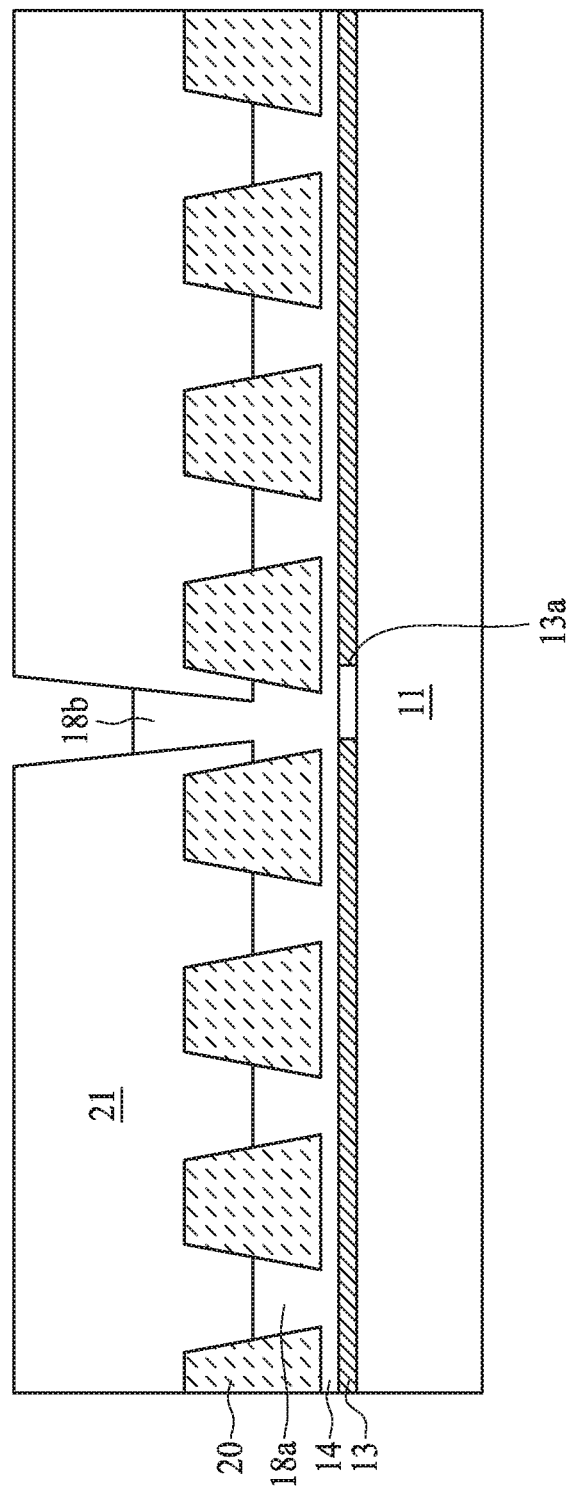
FIG. 4G illustrates one or more stages of a method of manufacturing a semiconductor device package in accordance with some embodiments of the present disclosure.
Figure 4H:
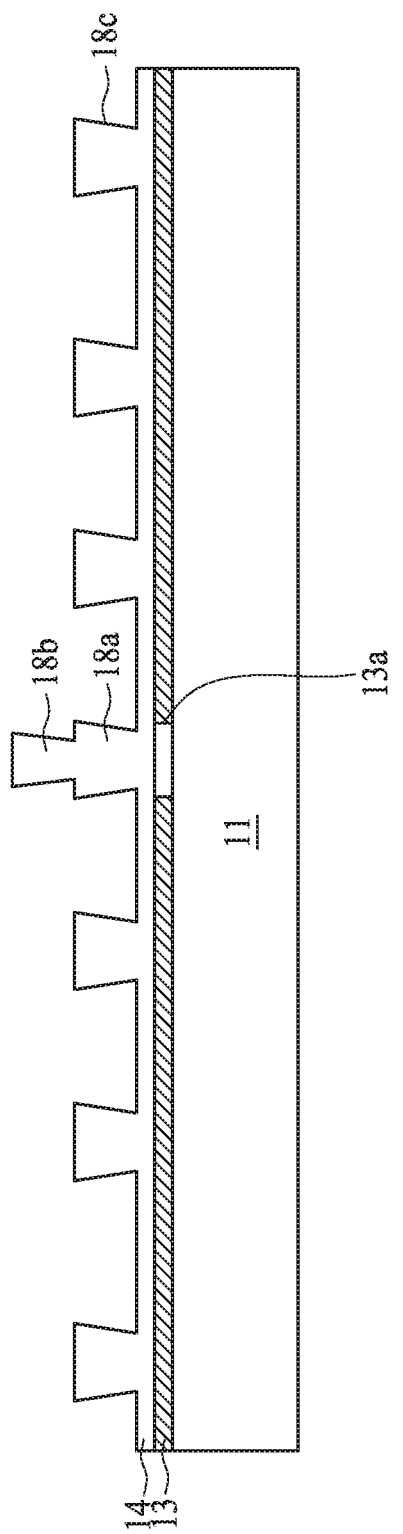
FIG. 4H illustrates one or more stages of a method of manufacturing a semiconductor device package in accordance with some embodiments of the present disclosure.
Figure 4I:
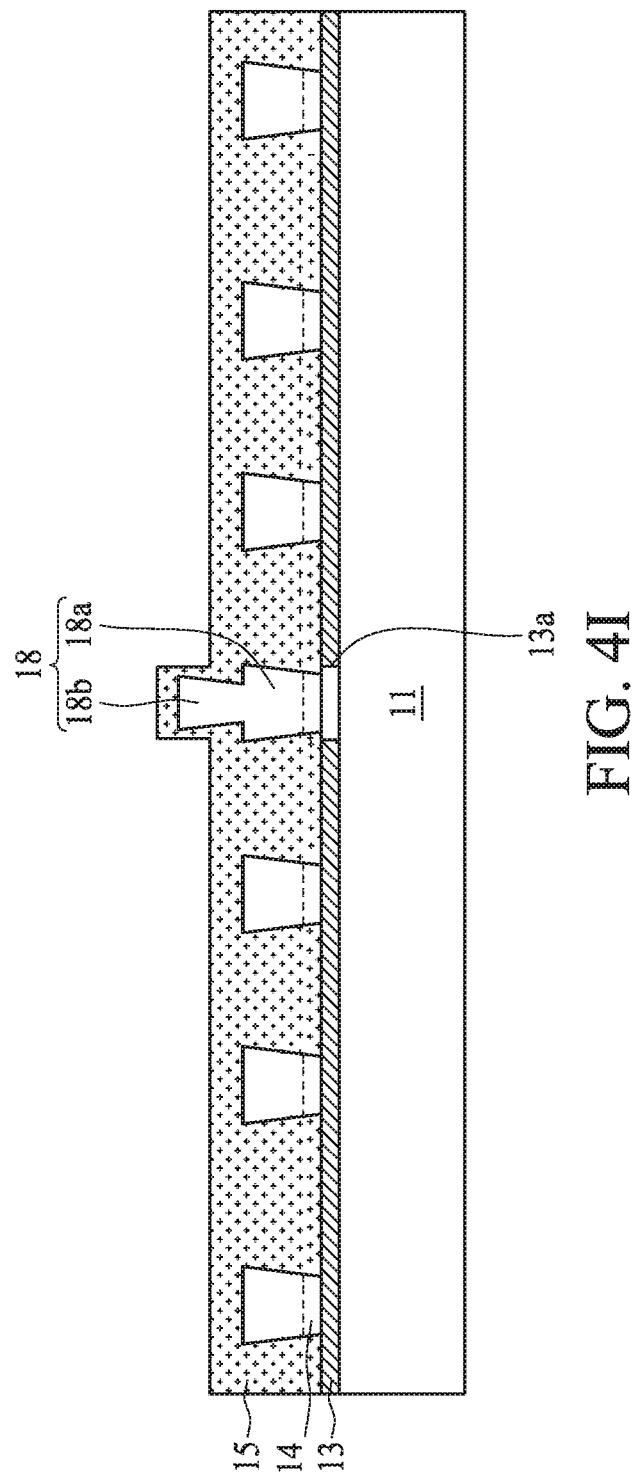
FIG. 4I illustrates one or more stages of a method of manufacturing a semiconductor device package in accordance with some embodiments of the present disclosure.
Figure 4J:
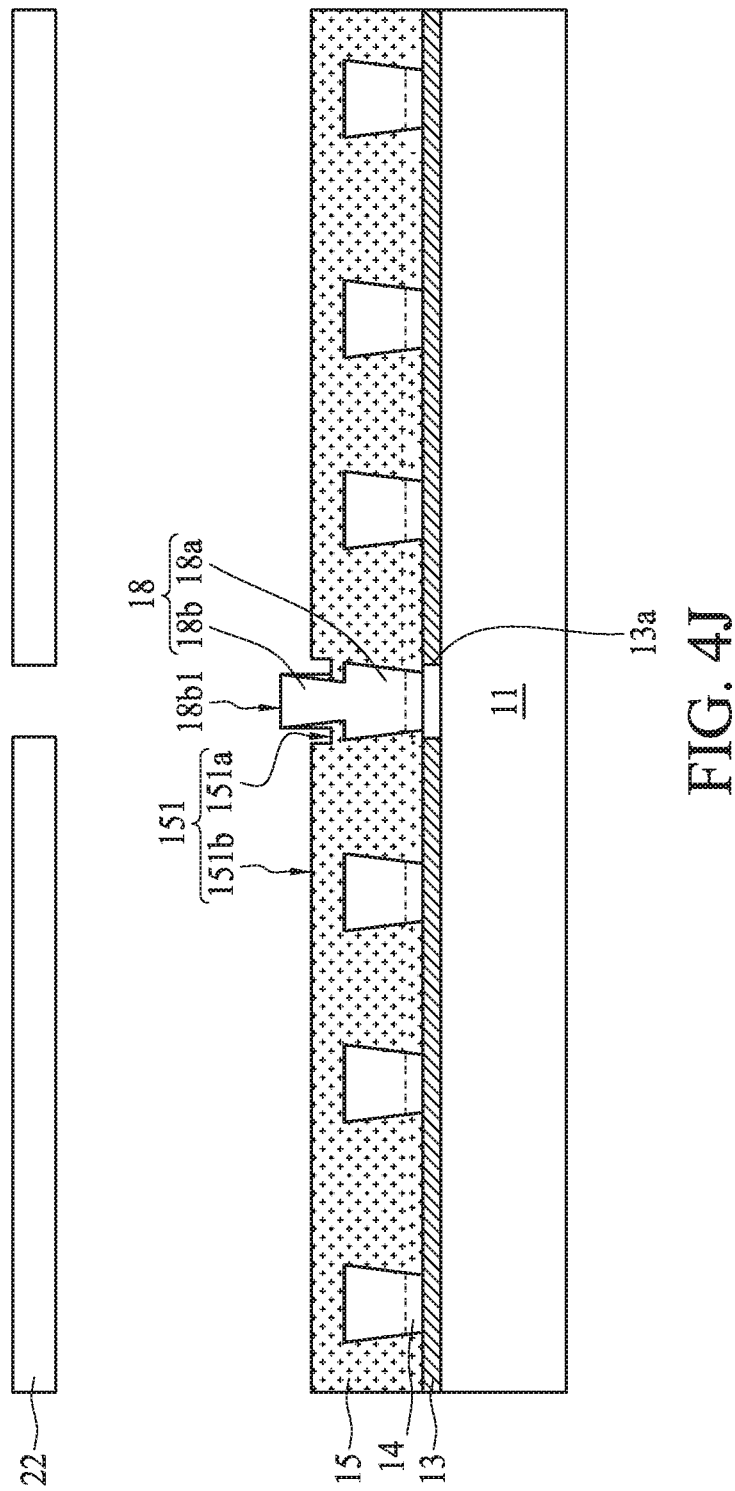
FIG. 4J illustrates one or more stages of a method of manufacturing a semiconductor device package in accordance with some embodiments of the present disclosure.

In some embodiments, the portion 151a is relatively rough as a result of the etching operation as illustrated in FIG. 4J. For example, the surface roughness of the portion 151a is higher than the surface roughness of the portion 151b. For example, the surface topography of the portion 151a has a substantially concave shape.

The portion of the dielectric layer 15 that surrounding the lateral surface 18b3 of the conductive pad 18b has a surface approximately perpendicular to the interface 151 between the underfill 16 and the dielectric layer 15. For example, the dielectric layer 15 may have a surface approximately perpendicular to the portion 151b of the interface 151 after the etching operation as illustrated in FIG. 4J.

Figure 3:
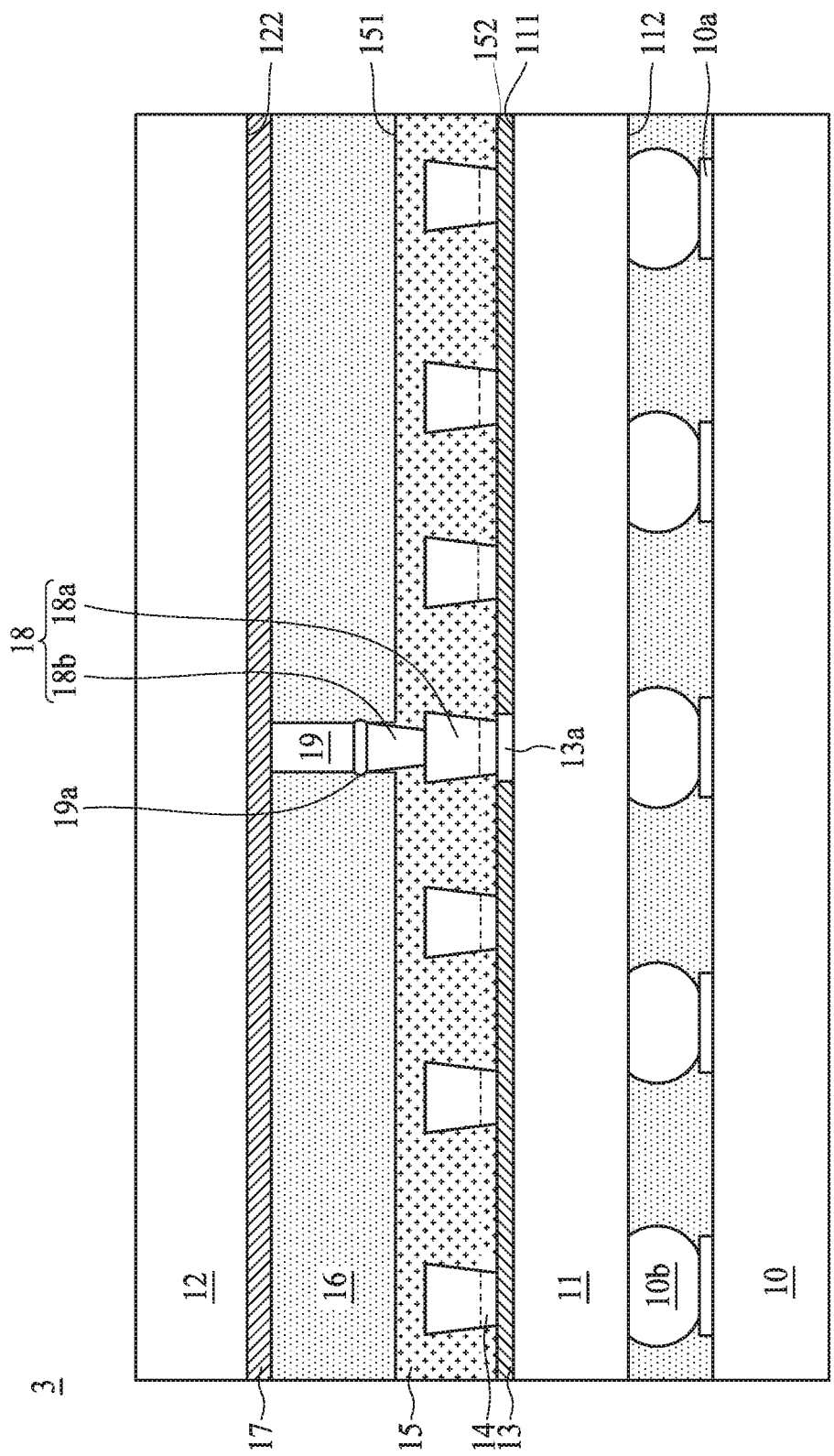
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1, and the differences therebetween are described below.

Figure 5A:
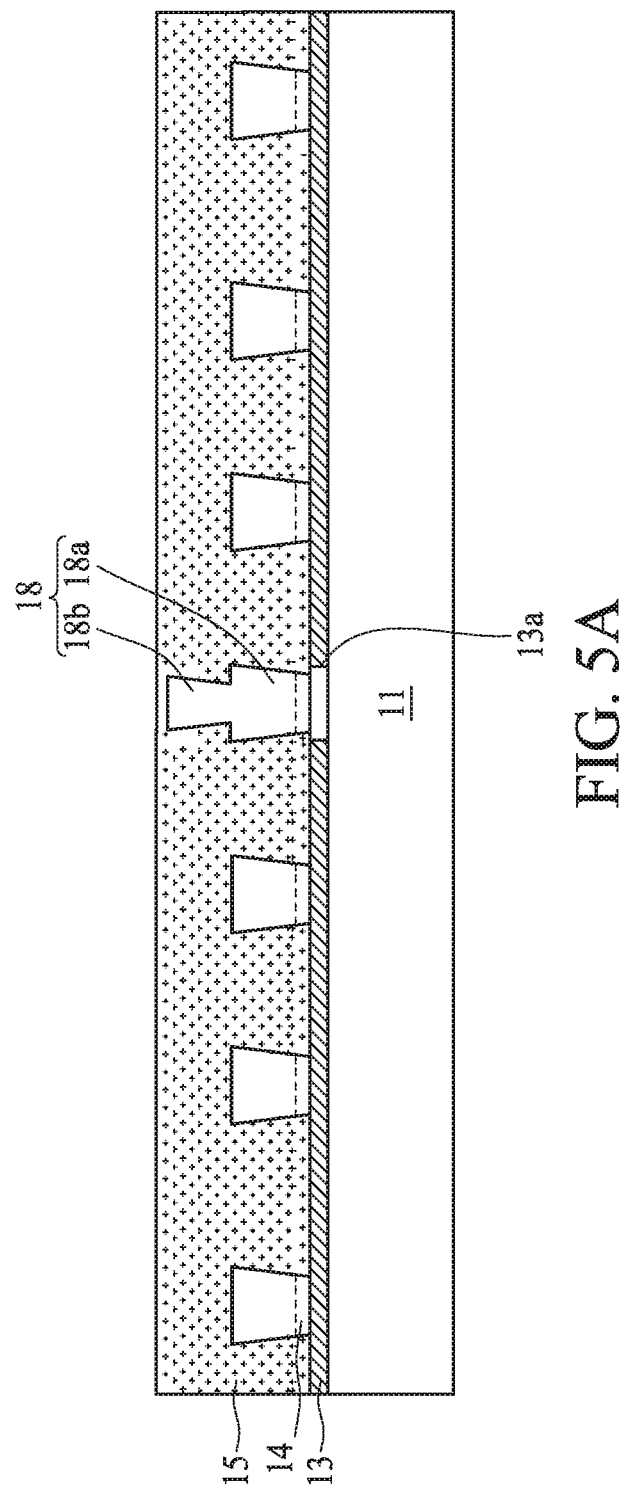
FIG. 5A illustrates one or more stages of a method of manufacturing a semiconductor device package in accordance with some embodiments of the present disclosure.

The interface 151 between the underfill 16 and the dielectric layer 15 is substantially at the same level or elevation. For example, no recessed portion (such as the portion 151a in FIG. 2) can be observed. In some embodiments, the interface 151 may be uneven due to an etching operation is conducted without employing a photoresist film (or a mask)

as illustrated in FIG. 5A. In such embodiments, the interface 151 may fluctuate at the same level, elevation, or scale throughout the interface 151.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, and FIG. 4L, are cross-sectional views of a semiconductor device package at various stages of fabrication, in accordance with some embodiments of the present disclosure. At least some of these figures have been simplified for a better understanding of the aspects of the present disclosure.

Referring to FIG. 4A, an electronic component 11 is provided. The electronic component 11 has a surface 111 and a surface 112 opposite the surface 111. The electronic component 11 includes a conductive pad 13a exposed from a passivation layer 13 provided on the surface 111 of the electronic component 11.

Referring to FIG. 4B, a conductive layer 14 (or a seed layer) is disposed on the passivation layer 13 to electrically connect to the conductive pad 13a. In some embodiments, the conductive layer 14 is formed by, for example, sputtering titanium and copper (Ti/Cu) or a TiW. In some embodiments, the conductive layer 14 may be formed by electroless plating Ni or Cu.

Referring to FIG. 4C, a photoresist 20 is formed on the conductive layer 14 by, for example, coating. One or more openings 20r are formed in the photoresist 20 by, for example, lithographic technique, to expose a portion of the conductive layer 14.

Referring to FIG. 4D, a conductive layer is disposed in the openings 20r and on the exposed portion of the conductive layer 14, forming a conductive pad 18a having a surface 18a1 exposed from the openings 20r. In some embodiments, the conductive pad 18a may be formed by plating Cu, Ag, Ni, Au, or another metal. In some embodiments, the conductive pad 18a may be formed by electroless plating Cu, Ni, Pb, or another metal. In some embodiments, the conductive pad 18a may be formed by printing Cu, Ag, Au, or another metal.

Referring to FIG. 4E, another photoresist 21 is formed to cover the conductive pad 18a by, for example, coating. The photoresist 21 fills in the openings 20r (illustrated in FIG. 4D).

Referring to FIG. 4F, a part of the photoresist 21 is removed to expose a portion of the surface 18a1 of the conductive pad 18a, and forming an opening 21r in the photoresist 21. In some embodiments, the opening 21r may be formed by, for example, lithographic technique. In some embodiments, a width of the opening 21r is smaller than a width of the opening 20r (illustrated in FIG. 4D).

Figure 4K:
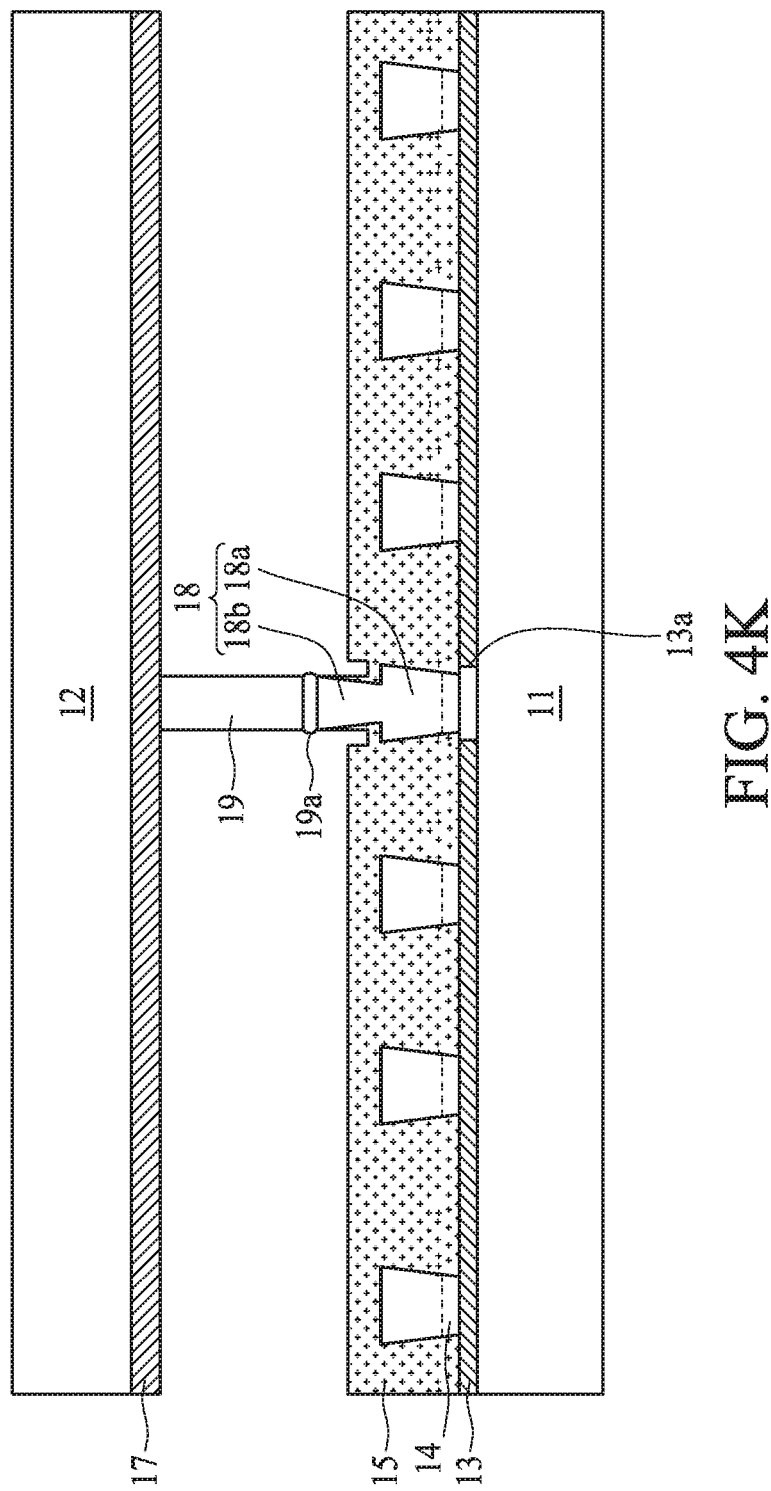
FIG. 4K illustrates one or more stages of a method of manufacturing a semiconductor device package in accordance with some embodiments of the present disclosure.

The surface 18a1 of the conductive pad 18a is partially exposed from the opening 21r defined by the photoresist 21. The opening 21r is formed to expose the conductive pad 18a to be connected to a conductive pillar (such as the conductive pillar 19 as illustrated in FIG. 4K).

Referring to FIG. 4G, a conductive layer is disposed in the openings 21r and on the exposed surface 18a1 of the conductive pad 18a, forming a conductive pad 18b.

Referring to FIG. 4H, the photoresists 20 and 21 are removed by etching, photoresist stripper or other suitable processes. After the removing operation, the conductive pad 18a, the conductive pad 18b disposed on the conductive pad 18a, the conductive pad 18c spaced apart from the conductive pad 18a, and other conductive pads on the electronic components 11 remain.

Referring to FIG. 4I, the conductive layer 14 is partially removed or etched by, for example, wet etching. Then a dielectric layer 15 is disposed to cover the conductive pads 18a, 18b, and 18c. In some embodiments, the dielectric layer 15 is conformally formed on the conductive pads 18a, 18b, and 18c. For example, the portion of the dielectric layer 15 disposed on the conductive pad 18b is higher than the portion of the dielectric layer 15 disposed on the conductive pad 18c. For example, the dielectric layer 15 is disposed on lateral surfaces of the conductive pad 18b and surrounds the conductive pad 18b. In some embodiments, the dielectric layer 15 is formed by, for example, coating, lamination or other suitable processes. In some embodiments, the dielectric layer 15 is formed by, for example, a spin coater. In some embodiments, the dielectric layer 15 over the conductive pad 18b is formed due to capillary phenomenon.

Referring to FIG. 4J, a portion of the dielectric layer 15 is removed by a mask 22 through, for example, lithographic technique. A recessing portion 151a is formed on the surface 151 of the dielectric layer 15. The portion 151a is recessed from the other portion 151b. The portion 151a may be relatively rough, and the portion 151b may remain even or unchanged.

In some embodiments, the dielectric layer 15 may have a surface approximately perpendicular to the surface 151 after the portion 151a is formed.

In some embodiments, after the portion 151a is formed, plasma descum (or degunk) operation may be conducted to remove residual dielectric layer 15 and/or contaminants on the topmost surface 18b1 of the conductive pad 18b.

The dielectric layer 15 may be a positive photoresist, and portions of the dielectric layer 15 exposed from the mask 22 may be removed, forming the recessing portion 151a. Due to the inverted trapezoid shape of the conductive pad 18b, a part of the dielectric layer 15 is unexposed and remained on the sidewall of the conductive pad 18b.

Although the operation shown in FIG. 4J illustrates a lithography operation applying positive photoresist, the present disclosure is not limited thereto. In some embodiments, a negative photoresist can be utilized.

Referring to FIG. 4K, another electronic component 12 is attached to the electronic component 11 by bonding the conductive pillar 19 and the electrical contact 19a to the conductive pad 18b.

Figure 4L:
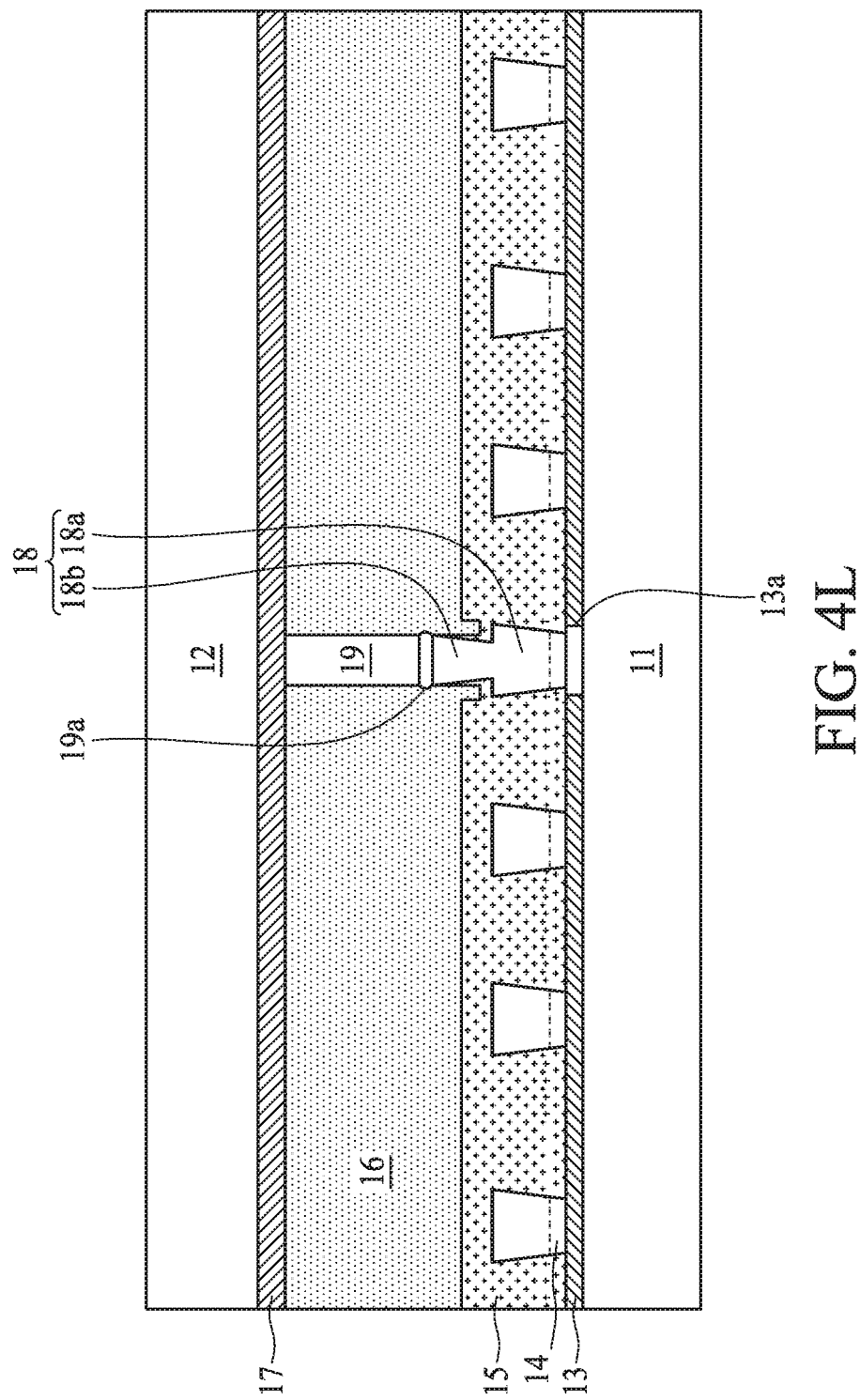
FIG. 4L illustrates one or more stages of a method of manufacturing a semiconductor device package in accordance with some embodiments of the present disclosure.

Referring to FIG. 4L, an underfill 16 is formed to surround the conductive pillar 19 and the conductive pad 18b.

In some embodiments, the structure obtained from FIGS. 4A thru 4L can be attached to a substrate (such as the substrate 10 as shown in FIG. 1) through an electrical contact (such as the electrical contact 10b as shown in FIG. 1). An underfill may be provided to surround the electrical contact 10b. The resulting structure may be similar to the semiconductor device package 1 in FIG. 1.

FIG. 5A, FIG. 5B, FIG. 5C, and FIG. 5D are cross-sectional views of a semiconductor device package at various stages of fabrication, in accordance with some embodiments of the present disclosure. At least some of these figures have been simplified for a better understanding of the aspects of the present disclosure. The operation shown in FIG. 5A may be conducted subsequent to the operation shown in FIG. 4H.

Referring to FIG. 5A, a dielectric is disposed to cover the conductive pads 18a, 18b, and 18c. In some embodiments, the dielectric layer 15 may have a substantially planar surface. For example, the dielectric layer 15 over the conductive pad 18b has substantially the same elevation or level with the dielectric layer 15 over the conductive pad 18c. For example, the dielectric layer 15 may be disposed as a blanket layer.

Figure 5B:
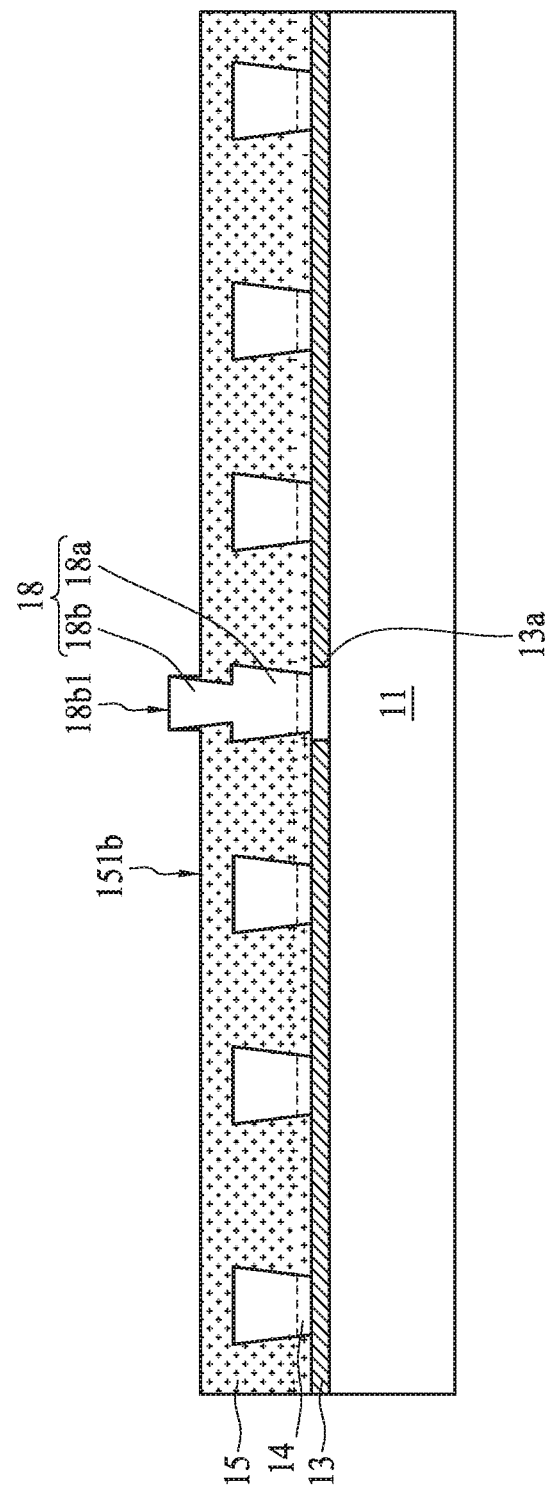
FIG. 5B illustrates one or more stages of a method of manufacturing a semiconductor device package in accordance with some embodiments of the present disclosure.

Referring to FIG. 5B, a portion of the dielectric layer 15 is removed through, for example, plasma descum (or degunk) operation. The operation in FIG. 5B can be conducted without a mask, which can decrease the manufacturing cost. Although not illustrated in the figures, in some embodiments, the dielectric layer 15 in FIG. 4I, which is conformally formed, may be partially removed without a mask as illustrated in FIG. 5B.

After the operation shown in FIG. 5B, the topmost surface 18b1 of the conductive pad 18b is exposed from the dielectric layer 15.

Figure 5C:
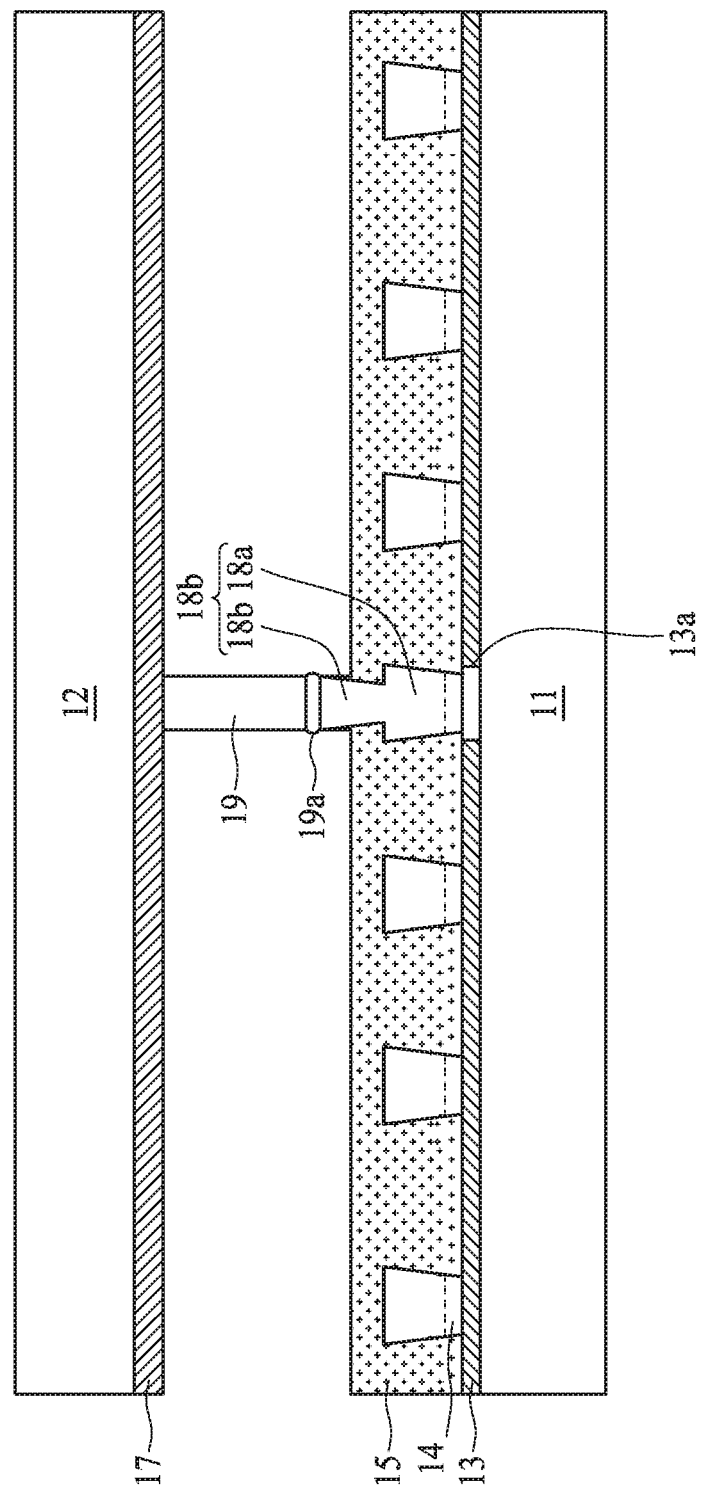
FIG. 5C illustrates one or more stages of a method of manufacturing a semiconductor device package in accordance with some embodiments of the present disclosure.

Referring to FIG. 5C, another electronic component 12 is attached to the electronic component 11 by bonding the conductive pillar 19 and the electrical contact 19a to the conductive pad 18b.

Figure 5D:
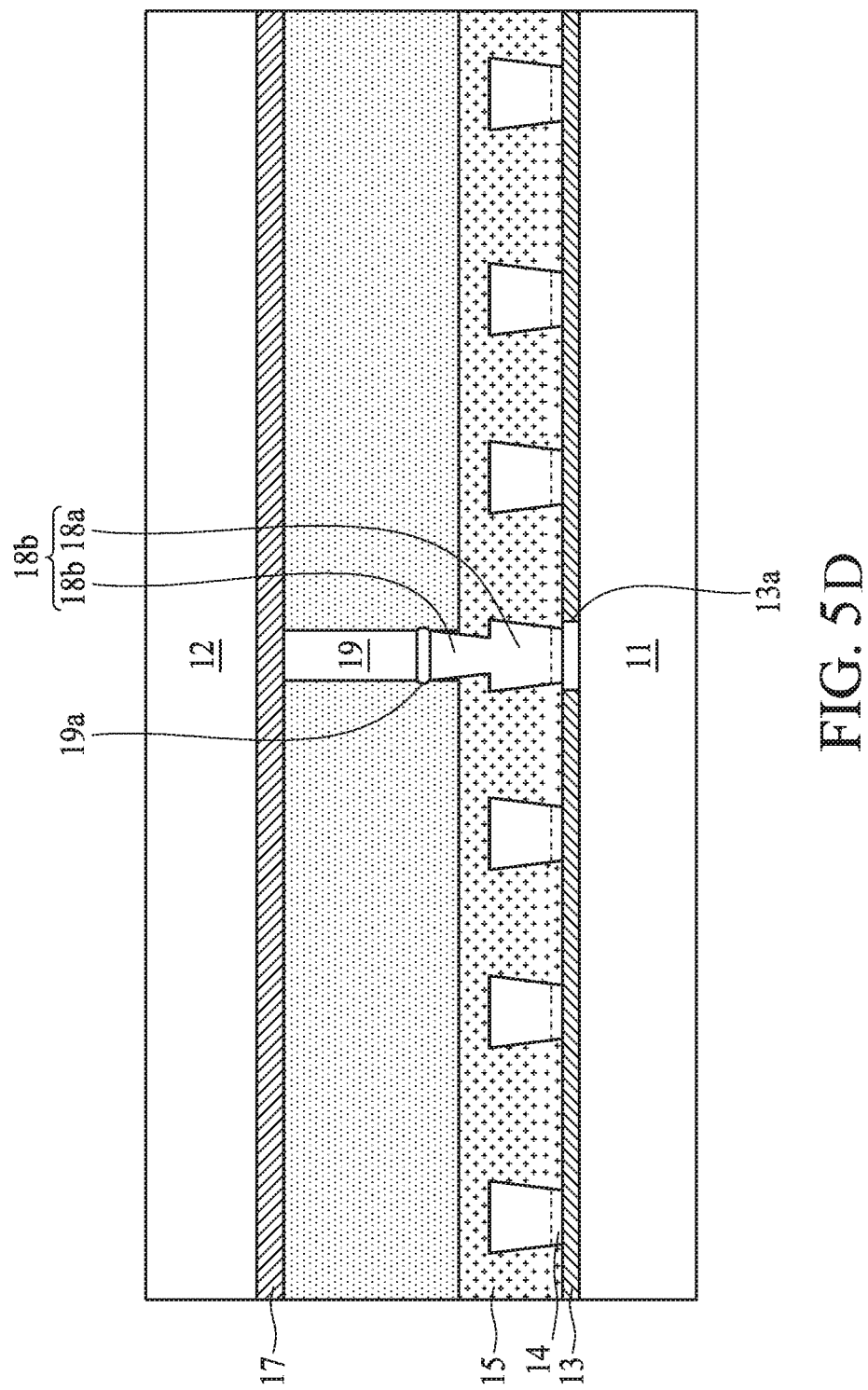
FIG. 5D illustrates one or more stages of a method of manufacturing a semiconductor device package in accordance with some embodiments of the present disclosure.

Referring to FIG. 5D, an underfill 16 is formed to surround the conductive pillar 19 and the conductive pad 18b.

In some embodiments, the structure obtained from FIGS. 4A thru 4I, and 5A thru 5D can be attached to a substrate (such as the substrate 10 as shown in FIG. 3) through an electrical contact (such as the electrical contact 10b as shown in FIG. 3). An underfill may be provided to surround the electrical contact 10b. The resulting structure may be similar to the semiconductor device package 3 in FIG. 3.

Figure 6A:
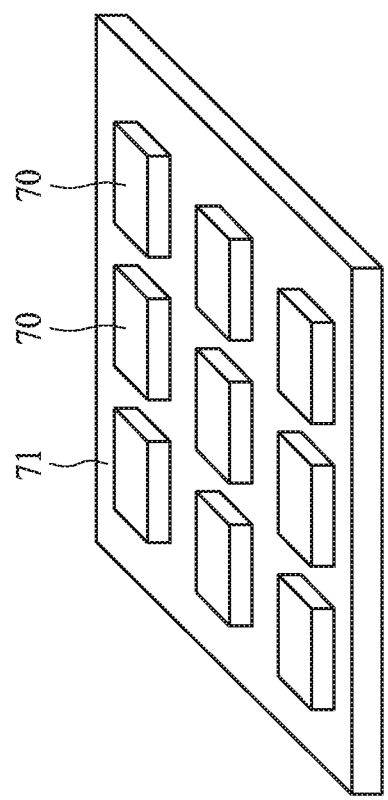
FIG. 6A illustrates examples of various types of semiconductor device packages in accordance with some embodiments of the present disclosure.
Figure 6B:
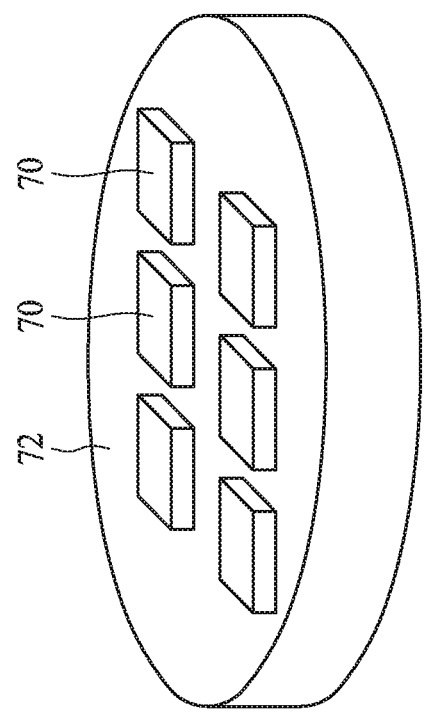
FIG. 6B illustrates examples of various types of semiconductor device packages in accordance with some embodiments of the present disclosure.

FIG. 6A and FIG. 6B illustrate examples of different types of semiconductor device packages in accordance with some embodiments of the present disclosure.

As shown in FIG. 6A, a plurality of chips 70 and/or dies are placed on a square-shaped carrier 71. In some embodiments, the chips 70 may include at least one of the semiconductor device packages 1 and 3 as shown in FIGS. 1 and 3. In some embodiments, the carrier 71 may include organic materials (e.g., a molding compound, bismaleimide triazine (BT), a PI, a polybenzoxazole (PBO), a solder resist, an Ajinomoto build-up film (ABF), a polypropylene (PP), an epoxy-based material, or a combination of two or more thereof) or inorganic materials (e.g., silicon, a glass, a ceramic, a quartz, or a combination of two or more thereof).

As shown in FIG. 6B, a plurality of chips 70 and/or dies are placed on a circle-shaped carrier 72. In some embodiments, the carrier 72 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
    a first electronic component having a first surface and a second surface opposite the first surface;
    a first pad disposed on the first surface of the first electronic component, wherein the first pad has a first surface facing away from the first surface of the first electronic component, a second surface opposite the first surface of the first pad, and a lateral surface extended between the first surface of the first pad and the second surface of the first pad;
    a second pad disposed on the first surface of the first pad, wherein the second pad has a first surface facing away from the first surface of the first pad, a second surface opposite the first surface of the second pad, and a lateral surface extended between the first surface of the second pad and the second surface of the second pad; and
    a dielectric layer disposed on the first surface of the first electronic component and covering the first surface and the lateral surface of the first pad;
    wherein a width of the first surface of the second pad is greater than a width of the second surface of the second pad; and
    wherein the dielectric layer fully covers the lateral surface of the second pad and exposes the first surface of the second pad.

2. The semiconductor device package of claim 1, wherein a width of the first surface of the first pad is greater than a width of the second surface of the first pad.

3. The semiconductor device package of claim 1, wherein a width of the first surface of the first pad is greater than a width of the second surface of the second pad.

4. The semiconductor device package of claim 1, wherein the first pad and the second pad taper toward the first surface of the first electronic component.

5. The semiconductor device package of claim 1, further comprises:
    a second electronic component having a surface facing the first surface of the first electronic component; and
    a conductive pillar electrically connecting the surface of the second electronic component with the first surface of the second pad.

6. The semiconductor device package of claim 1, further comprises:
a package body disposed on the dielectric layer and surrounding a portion of the dielectric layer fully covering the lateral surface of the second pad.

7. The semiconductor device package of claim 6, wherein the dielectric layer and the package body define an interface, the interface having a first portion proximal to the first pad and second portion distal from the first pad; and wherein the first portion of the interface is recessed from the second portion of the interface.

8. The semiconductor device package of claim 7, wherein a roughness of the first portion is greater than a roughness of the second portion.

9. The semiconductor device package of claim 7, wherein the portion of the dielectric layer fully covering the lateral surface of the second pad has a surface approximately perpendicular to the second portion of the interface.

10. A semiconductor device package, comprising:
a first electronic component having a first surface and a second surface opposite the first surface;
a first pad disposed on the first surface of the first electronic component, wherein the first pad has a first surface and a second surface;
a second pad disposed on the first surface of the first pad, wherein the second pad has a first surface and a second surface;
a second electronic component having a surface facing the first surface of the first electronic component;
a conductive pillar electrically connecting the surface of the second electronic component with the first surface of the second pad; and
a dielectric layer disposed on the first surface of the first electronic component and covering the first surface of the first pad;
wherein a width of the second surface of the second pad is smaller a width of the second surface of the first pad;
wherein the dielectric layer has a surface facing away from the first surface of the first electronic component, the surface of the dielectric layer having a first portion proximal to the first pad and second portion distal from the first pad; and
wherein the first portion is recessed from the second portion.

11. The semiconductor device package of claim 10, wherein a width of the first surface of the second pad is greater than a width of the second surface of the second pad.

12. The semiconductor device package of claim 10, wherein the dielectric layer fully covers a lateral surface of the second pad that extended between the first surface of the second pad and the second surface of the second pad.

13. The semiconductor device package of claim 10, wherein a roughness of the first portion is greater than a roughness of the second portion.

14. A method of manufacturing a semiconductor device package, comprising:
providing an electronic component;
disposing a first photoresist on the electronic component, the first photoresist having an opening;
forming a first conductive layer in the opening, the first conductive layer having a first surface exposed from the first photoresist;
disposing a second photoresist to cover the first surface of the first conductive layer;
removing a part of the second photoresist to expose a part of the first surface of the first conductive layer;
forming a second conductive layer on the exposed part of first surface of the first conductive layer;
disposing a dielectric layer on the electronic component to cover a lateral surface of the second conductive layer; and
removing a portion of the dielectric layer to form a recessing portion on the dielectric layer.

\* \* \* \* \*